United States Patent
Gasanov et al.

(10) Patent No.: US 8,775,914 B2
(45) Date of Patent: Jul. 8, 2014

(54) RADIX-4 VITERBI FORWARD ERROR CORRECTION DECODING

(75) Inventors: Elyar E. Gasanov, Moscow (RU); Pavel A. Panteleev, Moscow (RU); Ilya V. Neznanov, Moscow (RU); Andrey P. Sokolov, Moscow (RU); Yurii S. Shutkin, Moscow (RU)

(73) Assignee: LSI Corporation, San Jose, CA (US)

( * ) Notice: Subject to any disclaimer, the term of this patent is extended or adjusted under 35 U.S.C. 154(b) by 376 days.

(21) Appl. No.: 13/158,636

(22) Filed: Jun. 13, 2011

(65) Prior Publication Data

US 2012/0144274 A1 Jun. 7, 2012

(30) Foreign Application Priority Data

Dec. 2, 2010 (RU) .............................. 2010149150

(51) Int. Cl.
H03M 13/00 (2006.01)
H03M 13/39 (2006.01)
H03M 13/25 (2006.01)

(52) U.S. Cl.
CPC .......... *H03M 13/3961* (2013.01); *H03M 13/42* (2013.01); *H03M 13/256* (2013.01)
USPC .......................................... 714/796; 714/792

(58) Field of Classification Search
None
See application file for complete search history.

(56) References Cited

U.S. PATENT DOCUMENTS

| | | | |
|---|---|---|---|
| 5,594,742 A * | 1/1997 | Hemmati | 714/792 |
| 5,815,515 A * | 9/1998 | Dabiri | 714/795 |
| 6,233,712 B1 * | 5/2001 | Rhee et al. | 714/789 |
| 7,765,459 B2 | 7/2010 | Chae et al. | 714/795 |
| 8,271,858 B2 * | 9/2012 | Wang et al. | 714/780 |
| 2009/0063939 A1 * | 3/2009 | Yen | 714/792 |
| 2009/0063940 A1 * | 3/2009 | Yen et al. | 714/792 |
| 2011/0055667 A1 * | 3/2011 | Wang et al. | 714/780 |
| 2011/0292849 A1 * | 12/2011 | Cui et al. | 370/310 |
| 2012/0134325 A1 * | 5/2012 | Panteleev et al. | 370/329 |

* cited by examiner

*Primary Examiner* — Daniel McMahon
(74) *Attorney, Agent, or Firm* — Christopher P. Maiorana, PC

(57) ABSTRACT

A method for forward error correction decoding. The method generally includes steps (A) to (D). Step (A) may calculate a plurality of metrics of a codeword using a forward error correction process on a trellis having a plurality of stages. Step (B) may update the metrics over each of the stages. Step (C) may permute the metrics in each of the stages. Step (D) may generate a signal carrying a plurality of decoded bits of the codeword.

18 Claims, 11 Drawing Sheets

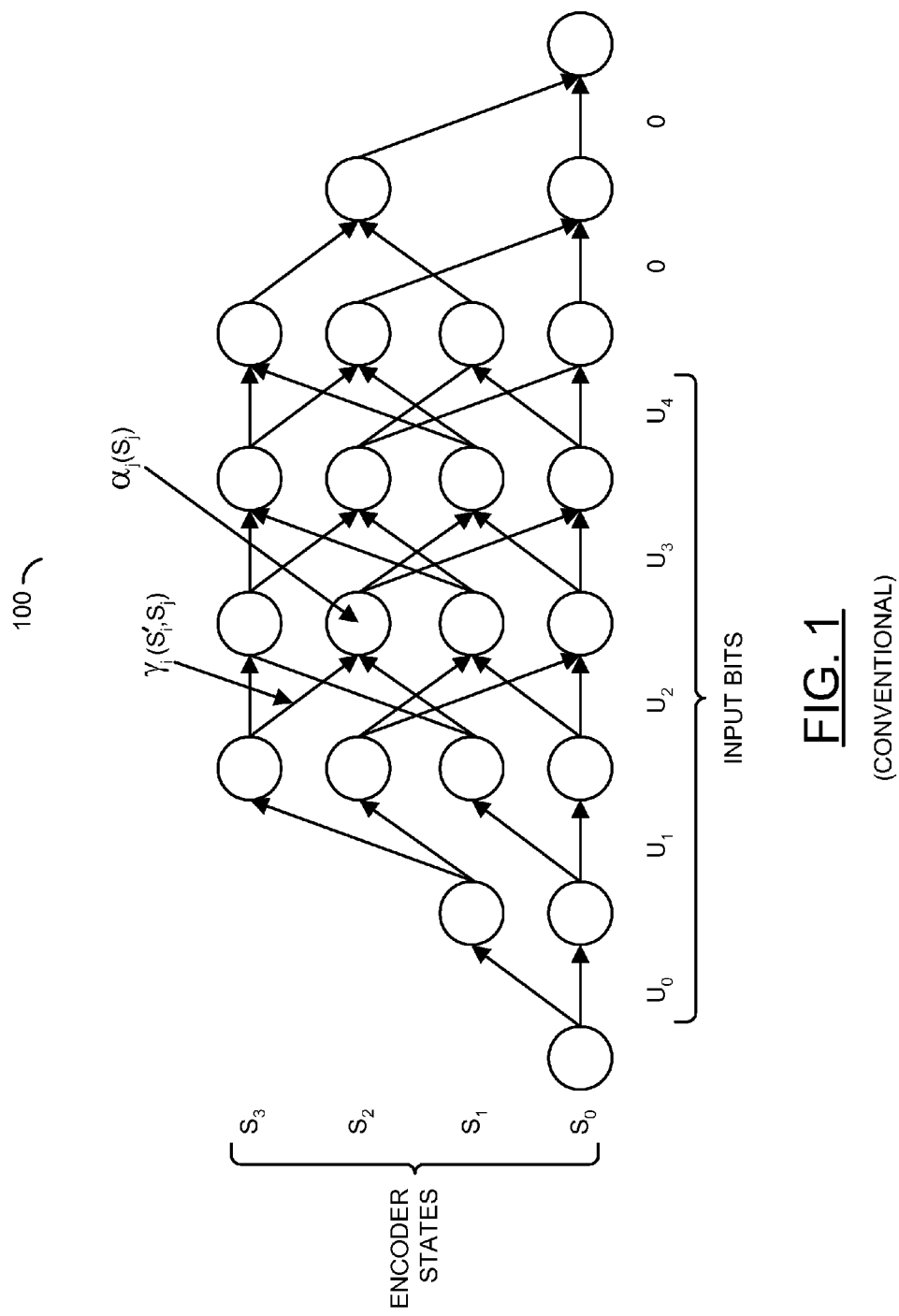
FIG. 1
(CONVENTIONAL)

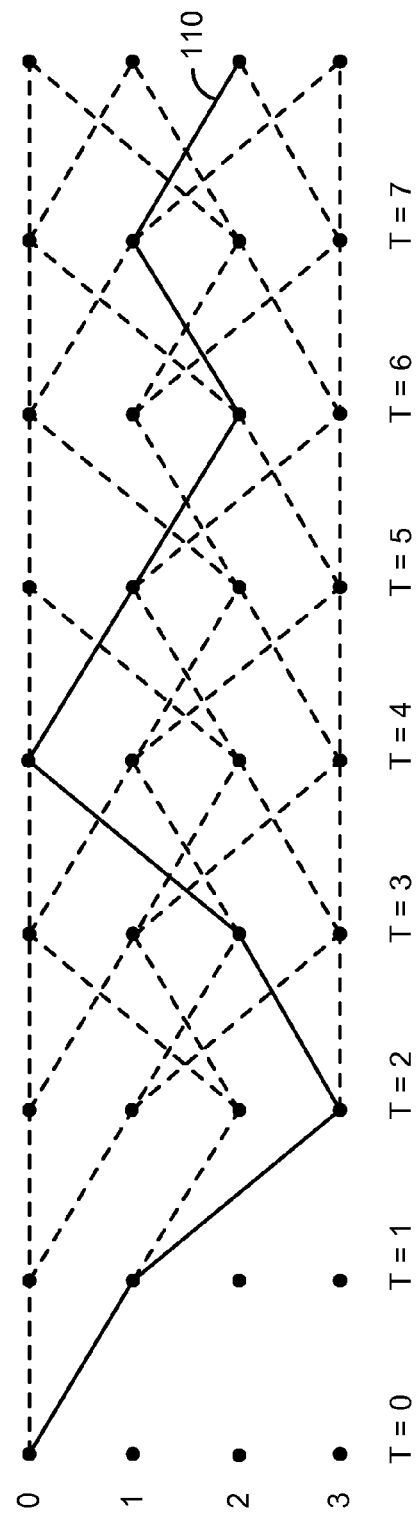
FIG. 2
(CONVENTIONAL)

RADIX-4 VITERBI FORWARD ERROR CORRECTION DECODING

This application claims the benefit of Russian Application No. 2010149150, filed Dec. 2, 2010 and is hereby incorporated by reference in its entirety.

The present application is related to co-pending Russian Application No. 2010148337 filed Nov. 29, 2010, and U.S. application Ser. No. 13/156,580 filed Jun. 9, 2011 which are hereby incorporated by reference in their entirety.

FIELD OF THE INVENTION

The present invention relates to forward error correction codes generally and, more particularly, to a method and/or apparatus for implementing radix-4 Viterbi forward error correction decoding.

BACKGROUND OF THE INVENTION

Wireless standards are using extensively in convolutional codes. A Viterbi decoding convolutional code often forms part of common convolutional decoders. The original Viterbi process, described in the late 1960's, has been overlooked in favor of less complex Viterbi processes.

The original derivation of the Viterbi process was in the probability domain. The output of the process is a sequence of decoded bits along with corresponding reliabilities. "Soft" reliability information is described by the A Posteriori Probability (APP) (i.e., P(u|y)). For an estimate of bit u (−1/+1) having received symbol y, an optimum soft output (i.e., L(u)) is calculated according to formula 1 as follows:

$$L(u) = \frac{\ln(P(u = +1|y))}{P(u = -1|y)} \quad (1)$$

The parameter L(u) is called a Log-Likelihood Ratio (LLR). The LLR value is a convenient measure that encapsulates both soft and hard bit information in a single number. The sign of the number corresponds to the hard decision while the magnitude gives a reliability estimate.

SUMMARY OF THE INVENTION

The present invention concerns a method for forward error correction decoding. The method generally includes steps (A) to (D). Step (A) may calculate a plurality of metrics of a codeword using a forward error correction process on a trellis having a plurality of stages. Step (B) may update the metrics over each of the stages. Step (C) may permute the metrics in each of the stages. Step (D) may generate a signal carrying a plurality of decoded bits of the codeword.

The objects, features and advantages of the present invention include providing radix-4 Viterbi forward error correction decoding that may (i) support multiple communications standards, (ii) share state metrics and branch metrics calculators between Viterbi decoding and turbo decoding, (iii) share schemes and parts between convolutional codes and turbo codes, (iv) permute state metrics and paths prior to buffering in memory and/or (v) compute state metrics and branch metrics in a single clock cycle.

BRIEF DESCRIPTION OF THE DRAWINGS

These and other objects, features and advantages of the present invention will be apparent from the following detailed description and the appended claims and drawings in which:

FIG. 1 is a diagram of an example trellis for a convolutional code;

FIG. 2 is a diagram of an example closest path through the trellis;

DETAILED DESCRIPTION OF THE PREFERRED EMBODIMENTS

Figure 3:
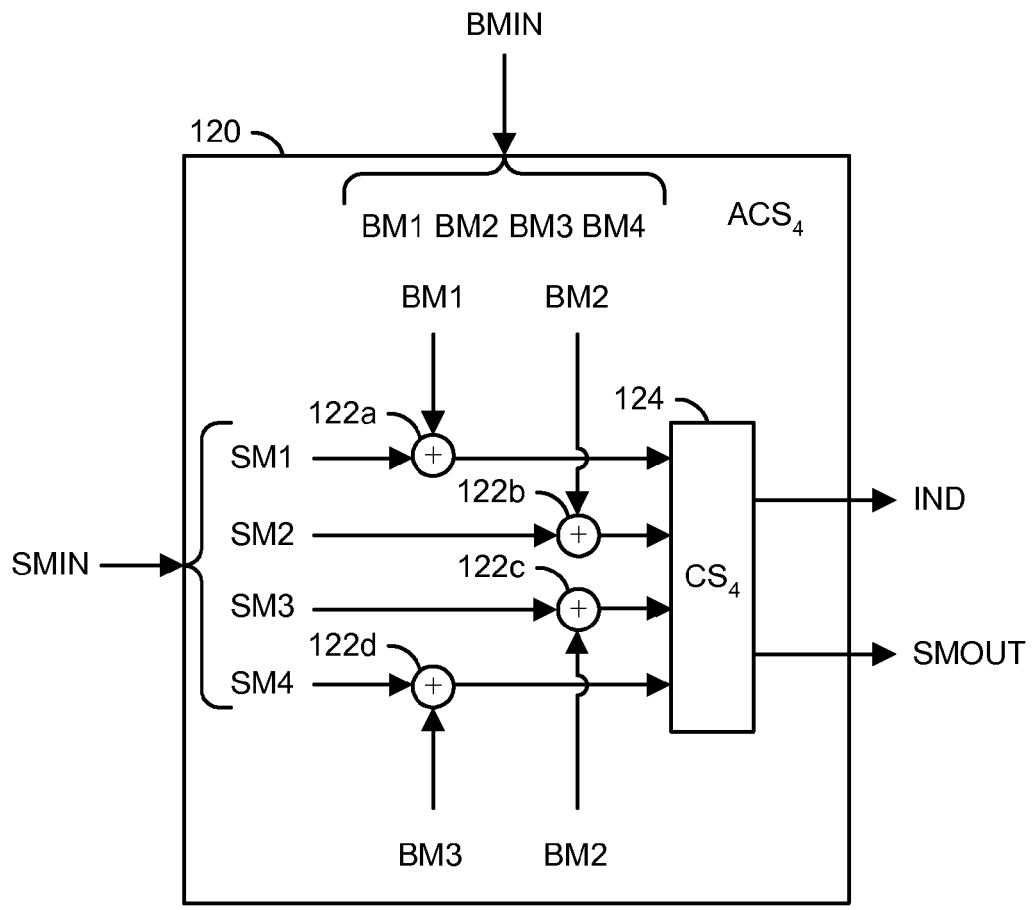
FIG. 3 is a block diagram of an add-compare-select circuit.

Some embodiments of the present invention generally concern a reconfigurable chip (or die) for decoding an encoded signal in accordance with two or more wireless communication standards. The wireless communications standards may include, but are not limited to, a Long Term Evolution (LTE) standard (3GPP Release 8), an Institute of Electrical and Electronics Engineering (IEEE) 802.16 standard (WiMAX), a Wideband-CDMA/High Speed Packet Access (WCDMA/HSPA) standard (3GPP Release 7) and a CDMA-2000/Ultra Mobile Broadband (UMB) standard (3GPP2). Other wired and/or wireless communications standards may be implemented to meet the criteria of a particular application.

Some embodiments may provide a Forward Error Correcting (FEC) decoder. The FEC decoder generally includes a radix-4 turbo decoder that uses existing branch and state metrics calculators for the Viterbi process. The FEC decoder generally performs at a high speed and occupies a small silicon area. For a codeword of length K, a processing time of the FEC decoder may be $C \times 2^m \times K$ clock cycles, where m is the constraint length and C may be a constant (e.g., approximately 1/16). For example, the value C may be 33/512 for convolutional codes with a constraint length of 8 (e.g., 256 states). The FEC decoder may support the convolutional codes and the turbo codes from multiple wireless communication standards, including but not limited to, LTE, WiMAX, W-CDMA, and CDMA2000. The FEC decoder may decode codewords compliant with the various communications standards while operating in different configurations.

The Viterbi process may be considered in a logarithmic domain. The decoding process, in native form, may be challenging to implement because of the exponentiation and multiplication. By implementing the process in the logarithmic domain, the multiplications generally become additions and the exponentials generally disappear. Additions may be transformed according to standard rules. The additions are generally replaced using the Jacobi logarithm according to formula 2 as follows:

$$\max{}^*(x,y) = \ln(e^x + e^y) = \max(x,y) + \ln(1 + e^{\hat{}}(-|x-y|)) \quad (2)$$

The Jacobi logarithm may be called a "max*" operation denoting essentially a maximum operator adjusted by a correction factor. The max* operation is generally used in the Maximum A Posteriori (MAP) process. In the Viterbi process, a maximum operation (e.g., max(x,y)) may be used.

Referring to FIG. 1, a diagram of an example trellis 100 for a convolutional code is shown. The Viterbi process is generally based on the trellis 100. The process may be performed on a block of K received symbols that correspond to the trellis 100 having a finite number of K stages. A transmitted bit u may be chosen from a set (−1,+1). Branch metrics (e.g., γ) and forward state metrics (e.g., α) are generally shown in the trellis 100. The forward state metrics α may also be called path metrics. The example illustrated generally shows only 4 states in the trellis 100. In a convolutional code, the trellis 100 may have more states (e.g., usual 256 or 64 states).

The Viterbi process is essentially a largest path process. Basically, a coded sequence of bits $U_0, U_1, U_2, \ldots$ may correspond to a path through an encoder trellis. Due to noise in the channel, a received sequence (e.g., r) may not correspond exactly to a path through the encoder trellis. The decoder generally finds a path through the trellis 100 that is closest to the received sequence r, where the measure of "closest" may be determined by the likelihood function appropriate for the channel.

Referring to FIG. 2, a diagram of an example closest path 110 through the trellis 100 is shown. The closest path 110 (solid line) generally corresponding to a true sequence of the transmitted bits. Other paths may exist early in the decoding, buy are usually eliminated after several iterations.

Consider a case involving a convolutional code with rate ⅓. At each clock cycle, an input of 4-radix decoder may receive six soft values (e.g., $Z_1^{(1)}, Z_2^{(1)}, Z_1^{(2)}, Z_2^{(2)}, Z_1^{(3)}$ and $Z_2^{(3)}$). A branch metric for edge e in the radix-4 Viterbi process for rate ⅓ convolutional code may be computed by formula 3 as follows:

$$\gamma(e) = \sum_{i=1}^{3} \left( (-1)^{u_1^{(i)}} z_1^{(i)} + (-1)^{u_2^{(i)}} z_2^{(i)} \right) \quad (3)$$

where $u_1^{(i)}, u_2^{(i)}$ may be parity bits associated with the edge e. The forward state metrics are recursively calculated and stored per formulae 4 and 5 as follows:

$$\alpha_0(s) = \begin{cases} 0, & s = 0 \\ -\infty, & s \neq 0 \end{cases} \quad (4)$$

$$\alpha_{t+1}(s') = \max_{s \xrightarrow{e} s'} \{\alpha_t(s) + \gamma(e)\}, t = 0, 1, \ldots, K-2 \quad (5)$$

If a data stream is decoded using the Viterbi process as described above, the paths through the trellis 100 generally have as many stages as the codeword is long. For a long data stream, a significant amount of data may be stored since the decoder would have to store $2^K$ paths and the paths lengths grow longer with each stage. Furthermore, the long paths may result in a long decoding latency.

In many cases, a single surviving path (e.g., maximum likelihood path) some number of stages back from the "current" stage of the trellis 100 generally permits the decoding to be ended early. The initial stages of the survivor paths tend to merge if a sufficient decoding delay is allowed. Therefore, a "window" on the trellis 100 may be kept in memory. The window generally includes the current stage and some number of previous stages. The number of the previous stages that the decoding looks at to make a decision is called the decoding depth, denoted by L. At time t, the decoder may generate a decision on the code bits $U_{(t-L)}$. An incorrect decoding decision on a finite decoding depth, called a truncation error, is typically small if the decoding depth is sufficiently large. For example, if a decoding depth of about five to ten constraint lengths is employed, little loss of performance due to truncation error may be experienced compared to using the full length. If the constraint length is m, the number of states (e.g, S) may be $2^m$. Considering convolutional codes with constraint lengths m=6 and m=8, the decoding depth may be set to approximately 40. The Viterbi process modified with the window may be called a sliding window Viterbi process.

Referring to FIG. 3, a block diagram of an apparatus 120 is shown. The apparatus (or device or circuit) 120 may implement an Add-Compare-Select (ACS) circuit for state metrics calculations. The circuit 120 generally comprises multiple adders (or modules) 122a to 122d and a circuit (or module) 124. The circuits 122a to 124 may represent one or more modules and/or blocks that may be implemented as hardware, firmware, software, a combination of hardware, firmware and/or software, or other implementations.

A signal (e.g., SM1) and a signal (e.g., BM1) may be received by the circuit 122a. The circuit 122b may receive a signal (e.g., SM2) and a signal (e.g., BM2). A signal (e.g., SM3) and a signal (e.g., BM3) may be received by the circuit 122c. The circuit 122d may receive a signal (e.g., SM4) and a signal (e.g., BM4). The signals SM1, SM2, SM3 and SM4 collectively may form an input signal (e.g., SMIN). The signals BM1, BM2, BM3 and BM4 collectively may form an input signal (e.g., BMIN). The circuit 124 may receive the sums from the circuits 122a to 122d. A signal (e.g., IND) may be generated by the circuit 124. The circuit 124 may also generate a signal (e.g., SMOUT).

The circuits 122a to 122d may implement adder circuits. Each circuit 122a to 122d may be operational to add a branch metric value and a respective state metric value. The sums may be the "add" portion of the add-compare-select operations.

The circuit 124 may implement a compare and select circuit. The circuit 124 is generally operational to compare the sum values calculated by the circuits 122a to 122d. The circuit 124 may also be operational to select a maximum sum value from among the sum values. The selected maximum sum value may be presented in the signal SMOUT as a new state metric value. The new state metric value may be computed per formula 6 as follows:

$$SMOUT = \max_{i \in \{0, \ldots, 3\}} \{SM_i + BM_i\} \quad (6)$$

An index value $i \in \{0, \ldots, 3\}$ of the selected maximum sum value may be presented in the signal IND. A width of the signal IND may be 2 bits.

Figure 4:
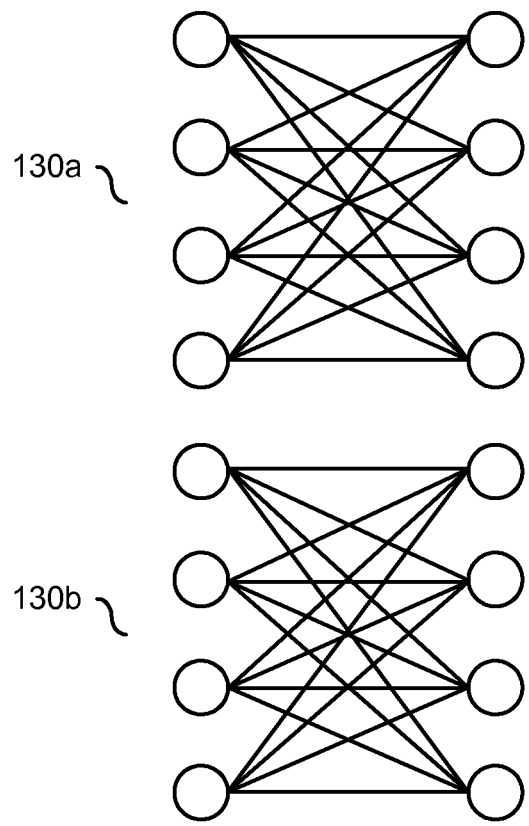
FIG. 4 is a diagram of fragments of the trellis.

Referring to FIG. 4, a diagram of fragments of the trellis 100 are shown. The fragments may be called a fragment 130a and a fragment 130b. Since the number of states of an encoder for turbo codes is generally fixed (e.g., 8 states), a state metrics calculator of a decoder for turbo codes may process all of the state metrics simultaneously. A normal state metrics calculator for turbo codes may be implemented as part of the Viterbi process in some embodiments of the present invention. Therefore, simultaneous processing of the states may involve processing half of the states per fragment 130a and the other half per fragment 130b.

Figure 5:
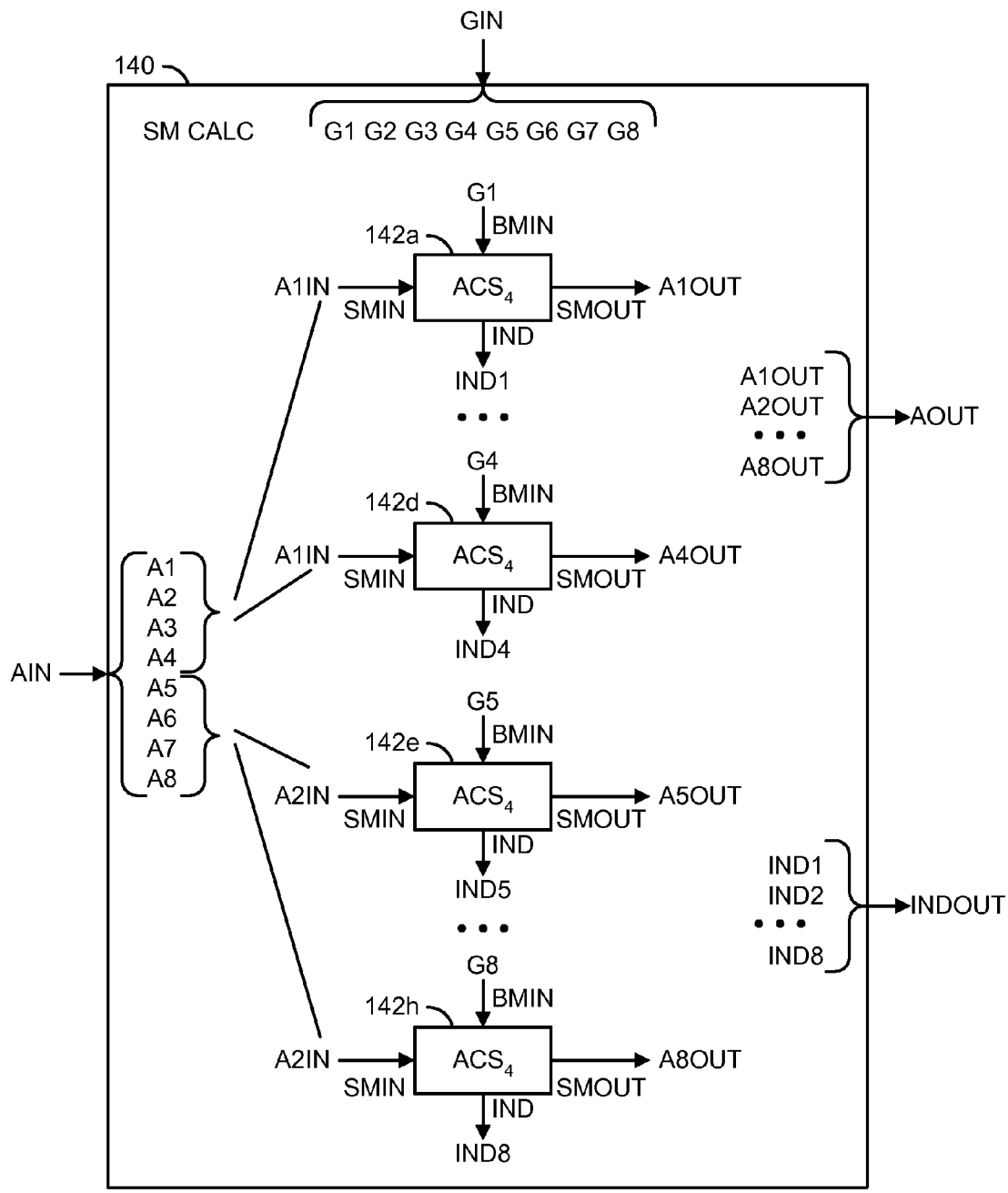
FIG. 5 is a block diagram of a state metrics calculator circuit.

Referring to FIG. 5, a block diagram of an apparatus 140 is shown. The apparatus (or device or circuit) 140 may implement a State Metrics Calculator (SCM) circuit. The apparatus 140 generally comprises multiple circuits (or modules) 142a to 142h. Each circuit 142a to 142h may be a copy of the circuit 120. Each circuit 142a to 142h may represent one or more modules and/or blocks that may be implemented as hardware, firmware, software, a combination of hardware, firmware and/or software, or other implementations.

An input signal (e.g., AIN) may be received by the circuit 140. An input signal (e.g., GIN) may also be received by the circuit 140. The circuit 140 may generate a signal (e.g., INDOUT). An output signal (e.g., AOUT) may be generated and presented by the circuit 140.

The signal AIN may convey multiple (e.g., 8) input state metrics values (e.g., A1 to A8). The input state metrics values A1 to A8 may correspond to the 8 left nodes of the fragments 130a and 130b. The input state metrics values A1 to A8 may be divided into several (e.g., 2) groups. A group A1IN generally includes the input state metrics values A1 to A4. Another group A2IN may include the input state metrics values A5 to A8. The group A1IN may be received by the circuits 142a to 142d. The group A2IN may be received by the circuits 142e to 142h.

The signal GIN may carry multiple (e.g., 32) input branch metrics values for corresponding to the edges of the fragments 130a and 130b of the trellis 100. The input branch metrics values may be divided into several (e.g., 8) groups. A group G1 may carry multiple (e.g., 4) input branch metrics values (e.g., γ1 to γ4) to the circuit 142a. A group G2 may carry multiple input branch metrics values (e.g., γ5 to γ8) to the circuit 142b, and so on. A group G8 may carry multiple input branch metrics values (e.g., γ29 to γ32) to the circuit 142h.

Each circuit 142a to 142h may generate a corresponding version of the signal SMOUT. The signals SMOUT may carry output state metrics values (e.g., A1OUT to A8OUT). The output state metrics values A1OUT to A8OUT may correspond to the 8 right nodes of the fragments 130a and 130b. Collectively, the output state metrics values A1OUT to A8OUT may form the signal AOUT.

Each circuit 142a to 142h may generate a corresponding version of the signal IND. The signals IND may carry pairs of index values (e.g., IND1 to IND8). Each pair of index values IND1 to IND8 generally identify where a maximum may be achieved. Collectively, the index values IND1 to IND8 may form the signal INDOUT.

Figure 6:
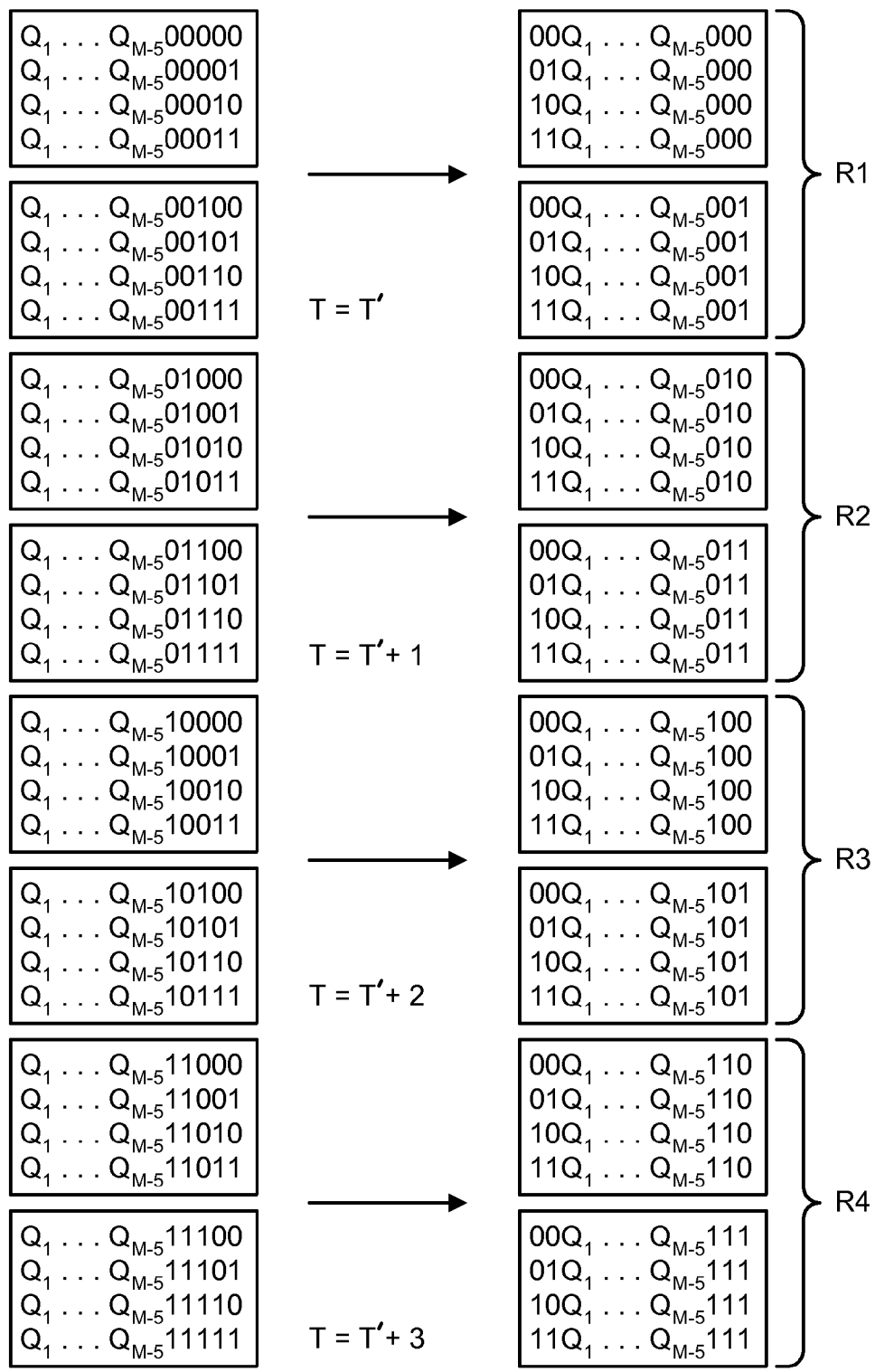
FIG. 6 is a diagram of four successive clock cycles of work of the state metrics calculator circuit.

Referring to FIG. 6, a diagram 150 of four successive clock cycles of work of the circuit 140 is shown. A record $q_1 q_2 \ldots q_m$ may denote the state metrics value $\alpha(q)$, where $q=q_1 q_2 \ldots q_m$. The left side of diagram 150 may be the input state metrics values and the right side may be the output state metrics values. An initial iteration of the clock cycle may occur at a time t=t'. The next iteration may occur at a time t=t'+1. Another iteration may occur at a time t=t'+2. The final iteration may occur at a time t=t'+3. As illustrated in FIG. 6, the input values generally follow successively, but the output values do not follow consecutively.

Since 8 successive input state metrics values are processed at the same time, the 8 input state values may be read from a single memory word (e.g., at single address or block of consecutive addresses). Since the 8 output state metrics are not consecutive, the calculated output state metrics should not be written to a single memory word because in the next iteration, the written information may be read in the successive manner. Therefore, the values obtained for the moment t=t' may be stored in a register (e.g., R1), the values obtained for the moment t=t'+1 may be stored in another register (e.g., R2), the values obtained for the moment t=t'+2 may be stored in a register (e.g., R3), and the values obtained for the moment t=t'+3 may be stored in a register (e.g., R4). After 4 clock cycles, the registers R1, R2, R3, R4 may buffer the information from 4 successive pieces of the state metrics.

Figure 7:
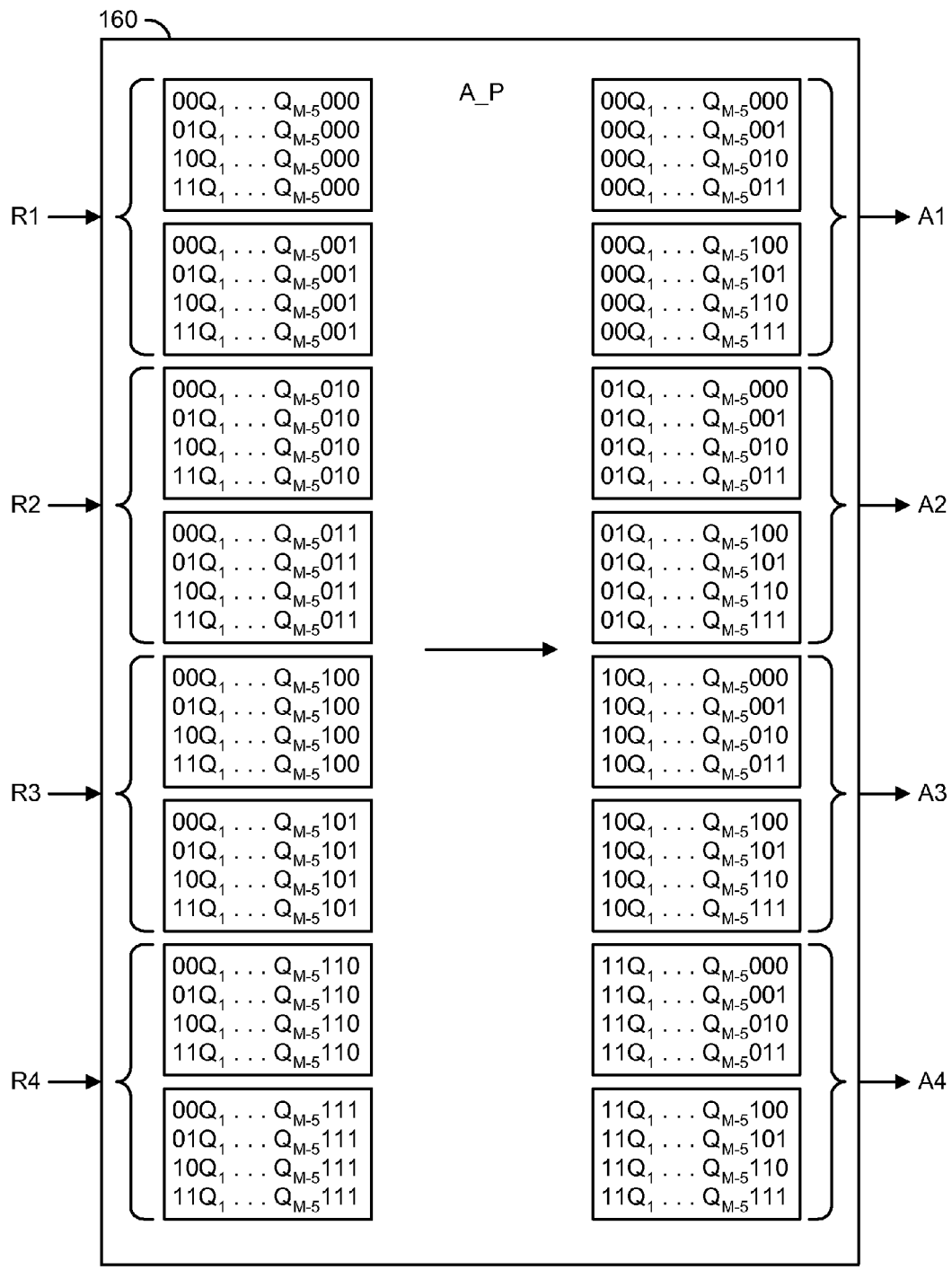
FIG. 7 is a block diagram of a scheme to permute the state metrics.

Referring to FIG. 7, a block diagram of a scheme 160 to permute the state metrics is shown. The scheme 160 may comprise a state metrics permutator (A_P) scheme. A record $q_1 q_2 \ldots q_m$ may denote the state metrics value $\alpha(q)$, where $q=q_1 q_2 \ldots q_m$. The inputs of the scheme 160 may be the state metrics values stored to the registers R1, R2, R3 and R4. The outputs may be 4 pieces of successive state metrics. Each piece generally includes 8 values and may be written in a single memory word (e.g., a single address or block of consecutive addresses). Therefore, the 4 pieces of the state metrics values may be stored simultaneously in 4 memory banks operating in parallel. An identification number of each memory bank may be determined from a few bits (e.g., the two most significant bits) of the state metrics values. The identification numbers generally indicate which of the memory banks should receive the data. For example, all of the state metrics values in the signal A1 may have the two most-significant bits of "00" (e.g., indicating a memory bank 00), all of the state metrics values in the signal A2 may have the two most-significant bits of "01" (e.g., indicating a memory bank 01), and so on.

In the sliding window Viterbi process, a given binary path may correspond to each state node of the trellis 100. The length of the given path may match the decoding depth L. If the constraint length m=8, the decoding depth L may be 40. A last part of the given path may be the state number, therefore only the beginning part of the given path may be stored. A length of the beginning part of the given path may be r=L−m. The stored beginning part of the given path may be denoted as p1p2 . . . pr, where p1 is last bit and pr is initial bit in the path.

Figure 8:
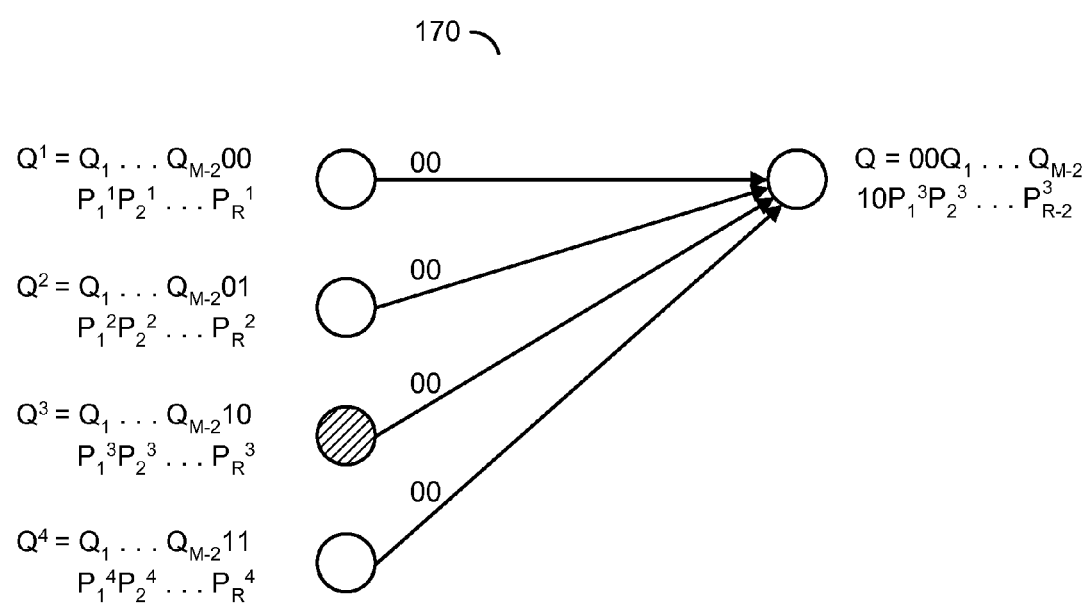
FIG. 8 is a diagram of a portion of the trellis.

Referring to FIG. 8, a diagram of a portion 170 of the trellis 100 is shown. Suppose that to each left node $q^i$ (i=1, 2, 3, 4), a corresponding path $p_1^i p_2^i \ldots p_r^i$ exists (the corresponding path may be the beginning part of full path). Suppose the maximum of the state metrics values (see formulae 4 and 5) may be archived in the node $q^3$ (e.g., the shaded node). Therefore, the beginning part of the path corresponding to the node q (e.g., the right node) may be $10 p_1^3 p_2^3 \ldots p_{r-2}^3$ and the full path may be $00 q_1 \ldots q_{m-2} 10 p_1^3 p_2^3 \ldots p_{r-2}^3$. The pair of bits $p_{r-1}^3 p_r^3$ may be presented at the time if a global maximum for all state metrics is archived in the node $q^3$.

Figure 9:
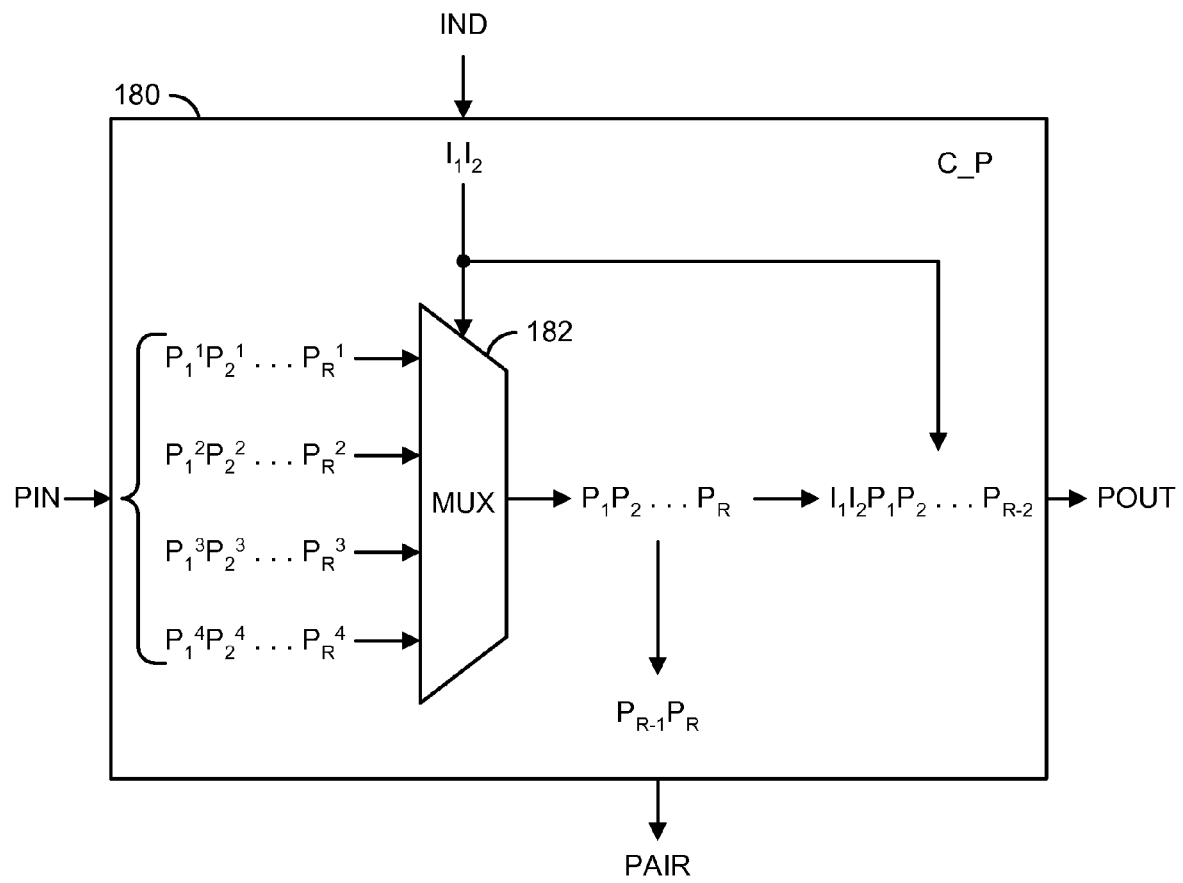
FIG. 9 is a block diagram of a calculate path circuit.

Referring to FIG. 9, a block diagram of an apparatus 180 is shown. The apparatus (or device or circuit) 180 may implement a Calculate Path (C_) circuit. The apparatus 180 is generally operational to calculate a path corresponding to a node of the trellis 100. The apparatus 180 generally comprises a circuit (or module) 182. The circuit 182 may represent one or more modules and/or blocks that may be implemented as hardware, firmware, software, a combination of hardware, firmware and/or software, or other implementations.

The circuit 180 may receive a signal (e.g., PIN). Circuit 180 may also receive the signal IND. A signal (e.g., PAIR) may be generated and presented from the circuit 180. A signal (e.g., POUT) may be generated and presented from the circuit 180. The circuit 182 may receive multiple (e.g., 4) components within the signal PIN. The bits carried by the signal IND may be received by the circuit 182 at a selection port. The circuit 182 may route the components of the signal PIN to the signals POUT and PAIR. The signal POUT may contain the components selected by the circuit 182 and the bits from the signal IND. The signal PAIR may contain the components selected by the circuit 182.

The circuit 182 may implement a multiplexer circuit. Circuit 182 is generally operational to multiplex the components received in the signal PIN based on the bits received in the signal IND. The components of the signal PIN may be the several (e.g., 4) paths, each path corresponding to a respective node of the trellis 100 (e.g., the left nodes in FIG. 8). The signal IND may be generated by the corresponding circuit 142a to 142h. The bits of the signal IND generally show where a maximum is archived among the paths (e.g., a most likely path). The signal POUT may identify a result path for the output node (e.g., the right nodes in the FIG. 8). The signal PAIR may carry candidates (e.g., $p_{r-1}p_r$) to the pair of bits to be presented by the decoder.

Figure 10:
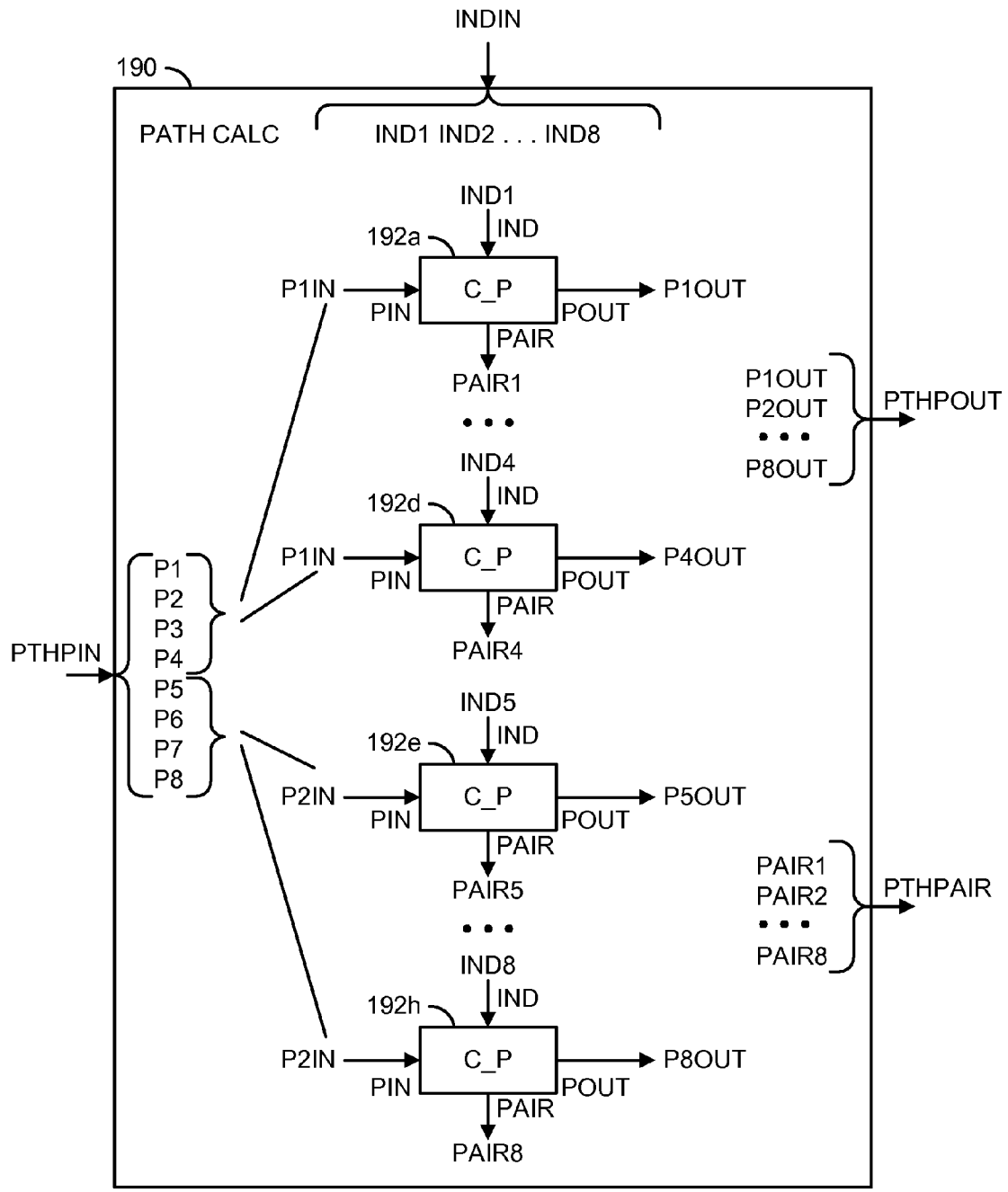
FIG. 10 is a block diagram of a path calculation circuit.

Referring to FIG. 10, a block diagram of an apparatus 190 is shown. The apparatus (or device or circuit) 190 may implement a path calculation circuit. The apparatus 190 generally comprises multiple circuits (or modules) 192a to 192h. Each circuit 192a to 192h may be a copy of the circuit 180. Each circuit 192a to 192h may represent one or more modules and/or blocks that may be implemented as hardware, firmware, software, a combination of hardware, firmware and/or software, or other implementations.

An input signal (e.g., PTHIN) may be received by the circuit 190. An input signal (e.g., INDIN) may also be received by the circuit 190. The circuit 190 may generate a signal (e.g., PTHOUT). An output signal (e.g., PTHPAIR) may be generated and presented by the circuit 190.

The signal PTHIN may convey multiple (e.g., 8) paths (e.g., P1 to P8). The paths P1 to P8 may correspond to the 8 left nodes of the fragments 130a and 130b. The paths P1 to P8 may be divided into several (e.g., 2) groups. A group (e.g., P1IN) generally includes the paths P1 to P4. Another group (e.g., P2IN) may include the paths P5 to P8. The group P1IN may be received by the circuits 192a to 192d. The group P2IN may be received by the circuits 192e to 192h.

The signal INDIN may carry the pairs of index values IND1 to IND8 generated by the circuit 140. The index values IND1 may be presented to the circuit 192a. The index values IND2 may be presented to the circuit 192b, and so on. The index values IND8 may be received by the circuit 192h.

Each circuit 192a to 192h may generate a corresponding version of the signal POUT. Each signal POUT may carry a corresponding path (e.g., P1OUT to P8OUT). Collectively, the paths P1OUT to P8OUT may form the signal PTHOUT.

Each circuit 192a to 192h may generate a corresponding version of the signal PAIR. Each signal PAIR may carry a respective pair of bits (e.g., PAIR1 to PAIR8). Collectively, the pairs of bits PAIR1 to PAIR8 may form the signal PTHPAIR.

The circuit 190 may implement a path calculation circuit. The circuit 190 may be operational to calculate paths corresponding to 8 nodes of the trellis 100 simultaneously. The signal PTHIN may contain the 8 beginning parts of paths corresponding to the 8 input nodes (left nodes in FIG. 4). The signal INDIN generally carries the 8 2-bit index values that show where the maximums are archived. The signal INDIN may be a delayed version of the signal INDOUT as generated by the circuit 140. The signal PTHOUT may contain the calculated 8 beginning parts of the paths corresponding to 8 output nodes (right nodes in FIG. 4). The signal PTHPAIR generally carries the 8 candidates to the bit pair presented by the decoder.

Figure 11:
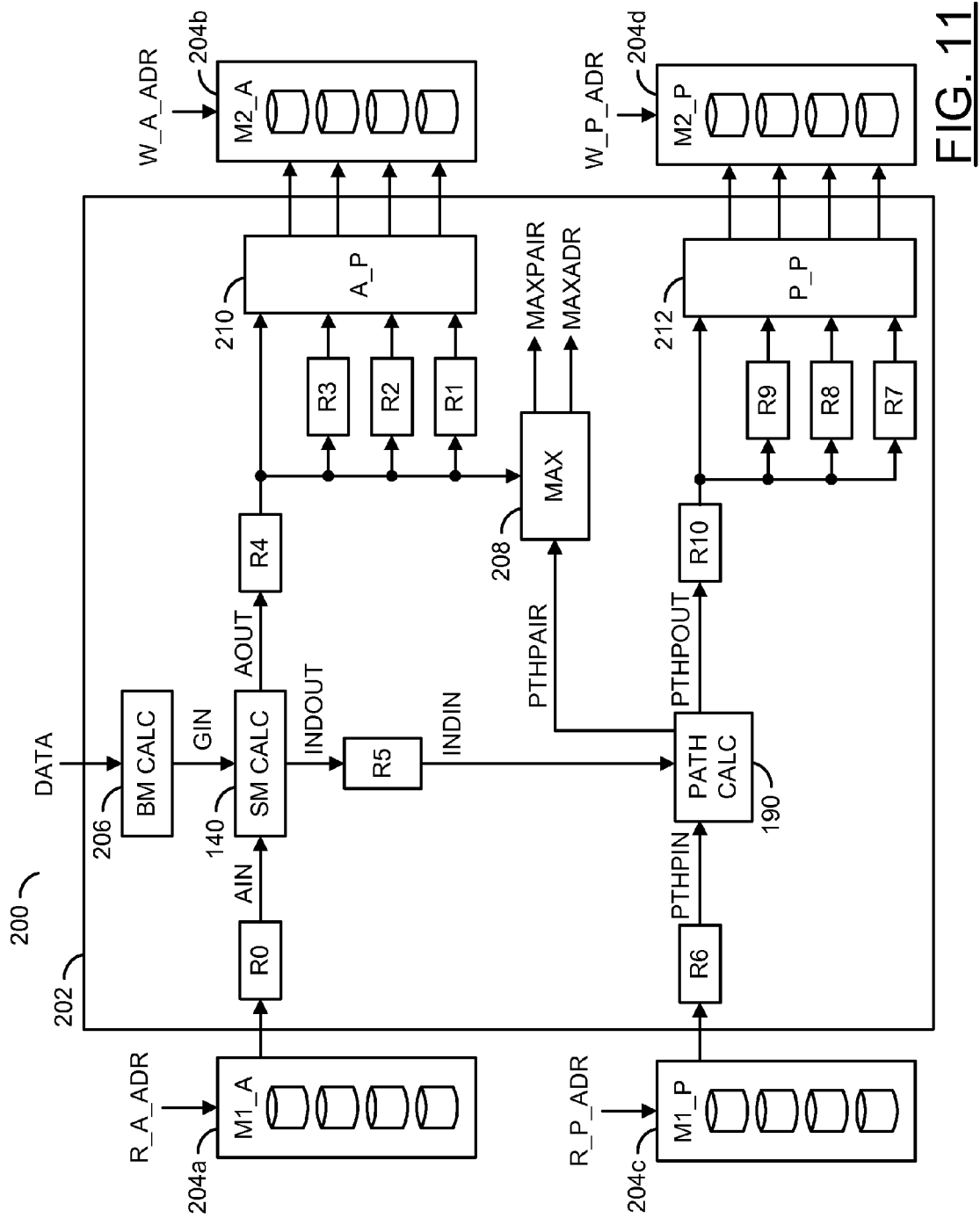
FIG. 11 is a block diagram of an apparatus in accordance with a preferred embodiment of the present invention.

Referring to FIG. 11, a block diagram of an apparatus 200 is shown in accordance with a preferred embodiment of the present invention. The apparatus (or device or circuit) 200 may implement a forward error correction decoder. The circuit 200 generally comprises a circuit (or module) 202 and one or more circuits (or modules) 204a to 204d. The circuits 202 to 204d may represent one or more modules and/or blocks that may be implemented as hardware, firmware, software, a combination of hardware, firmware and/or software, or other implementations.

An input signal (e.g., DATA) may be received by the circuit 202. The signal DATA may carry one or more encoded codewords. A read address signal (e.g., R_A_ADR) may be received by the circuits 204a (shown) and the circuit 204b. A write address signal (e.g., W_A_ADR) may be received by the circuits 204a and 204b (shown). A read address signal (e.g., R_P_ADR) may be received by the circuits 204c (shown) and 204d. A write address signal (e.g., W_P_ADR) may be received by the circuits 204c and 204d (shown). An output signal (e.g., MAXPAIR) may be generated by the circuit 202. An output signal (e.g., MAXADR) may also be generated by the circuit 202.

The circuit 202 may implement a decoder circuit. Circuit 202 is generally operational to calculate a plurality of state metrics and a plurality of paths of a codeword using a forward error correction process on the trellis 100. If the codeword length K=2N, the trellis 100 generally has N stages. Approximately $(2^{(m-3)})+1$ iterations (clock cycles) may be performed by the circuit 202 in each stage to update the state metrics and the paths, where m is the constraint length. The circuit 202 may also be operational to update the state metrics and paths over the N stages. Multiple sets of the state metrics and paths may be permuted in each of the N stages. When the initial iterations have been completed, the circuit 202 may present the initial two decoded bits in the signal MAXPAIR. The iterations may continue to present additional decoded bit pairs until the entire codeword has been decoded.

Each circuit 204a to 204d implements a memory circuit. The circuits 204a and 204b may be operational to store state metrics values during the iterations. Circuits 204c and 204d may store the path data during the iterations. In some embodiments, each circuit 204a to 204d may be implemented as a separate memory circuit. In other embodiments, two or more of the circuits 204a to 204d may be formed in a common memory circuit. Other memory arrangements may be implemented to meet the criteria of a particular application.

In some embodiments, the circuit 204a may have 4 memory banks. Circuit 204a may be used to store state metrics values. The width of each memory bank may be 8*Aw bits, where Aw is width of state metrics values (e.g., Aw=12). A size of each memory bank may be 256/(8*4)=8 addressable words. The signal R_A_ADR may be a read address that successively changes from 0 to 31. The 2 most significant bits of the signal R_A_ADR may identify the numbers (e.g., 00, 01, 10, 11) of the memory banks. In some embodiments, the signal R_A_ADR may have a width of 5 bits.

The circuit 204b may also have 4 memory banks. Circuit 204b may be similar to the circuit 204a. The signal W_A_ADR may be a write address. The permuted state metrics may be written from the registers R1 to R4 to all 4 memory banks simultaneously. The write addresses of all memory banks may be the same address. The signal W_A_ADR may have a width of 3 bits.

In some embodiments, the circuit 204c may have 4 memory banks. Circuit 204c may store paths corresponding to the nodes of the trellis 100. The width of each memory bank may be 8×Pw bits, where Pw may be a width of each path (e.g., Pw=32). A size of each memory bank may be 256/(8*4)= 8 addressable words. The signal R_P_ADR may be a read address that successively changes from 0 to 31. The 2 most significant bits of the signal R_P_ADR may identify the numbers (e.g., 00, 01, 10, 11) of the memory banks. In some embodiments, the signal R_P_ADR may have a width of 5 bits.

The circuit 204d may also have 4 memory banks. Circuit 204d may be similar to the circuit 204c. The signal W_P_ADR may be a write address. The permuted paths may be written from the registers R7 to R10 to all 4 memory banks simultaneously. The write addresses of all memory banks may be the same address. The signal W_P_ADR may have a width of 3 bits.

Circuit 202 generally comprises the circuit 140, the circuit 190, a circuit (or module) 206, a circuit (or module) 208, a circuit (or module) 210, a circuit (or module) 212 and multiple registers (or modules) R0 to R10. The circuits 206 to 212 and the registers R0 to R10 may represent one or more modules and/or blocks that may be implemented as hardware, firmware, software, a combination of hardware, firmware and/or software, or other implementations.

The circuit 206 may implement a branch metric calculation circuit. The circuit 206 may be operational to calculate branch metrics for the codewords received in the signal DATA. The branch metrics may be presented in the signal GIN. The circuit 206 may produce 32 branch metrics corresponding to edges of fragments 130a and 130b in FIG. 4. Therefore, the width of the output branch metrics may be 32×Bw, where Bw is a width of each branch metrics. In some embodiments Bw=12. Details of an embodiment of the circuit 206 may be found in co-pending Russian Application No. 2010148337 and U.S. application Ser. No. 13/156,580, hereby incorporated by reference in their entirety. In some embodiments, the circuit 206 may be implemented by a common design.

The circuit 208 may implement a maximum selection circuit. Circuit 208 is generally operational to find maximums among all state metrics and present the found results in the signals MAXPAIR and MAXADR. In some embodiments, 256 state metrics may be implemented (for m=8). Signal MAXADR may carry the address (e.g., a number of the state) of the maximal state metrics. The width of the signal MAXADR is generally 8 bits. The signal MAXPAIR may contain pairs of bits (i) obtained by the circuit 190 and (ii) corresponding to state node with the number in the signal MAXADR. The width of the signal MAXPAIR may be 2 bits. The information in the signals MAXADR and MAXPAIR may be the decoded output generated by a Viterbi decoding process (or circuit) of the decoder.

The circuit 210 may implement a state metrics permutator circuit. Circuit 210 may be operational to permute the state metrics values as described for scheme 160 in FIG. 7. The permuted state metrics may be stored in the circuits 204a and 204b alternately during even stages and odd stages.

The circuit 212 may implement a path permutator circuit. Circuit 212 may be operational to permute the paths in a manner similar to the circuit 210. The permuted paths may be stored in the circuits 204c and 204d alternately during even stages and odd stages.

The registers R0 to R10 may implement multi-bit register circuits. Register R0 may buffer state metrics values from the circuits 204a and 204b to the circuit 140. Registers R1, R2 and R3 may buffer state metrics values from the register R4 to the circuit 210. The register R4 may buffer state metrics values from the circuit 140 to the circuits 208 and 210 and the registers R1, R2 and R3. The registers R0, R1, R2, R3 and R4 may implement (8×Aw)-bit registers, where Aw may be a width of each state metrics value.

The register R5 may buffer index values from the circuit 140 to the circuit 190. The index values may be received from the circuit 140 in the signal INDOUT. The index values may be transferred to the circuit 190 in the signal INDIN. Register R5 generally has a width of 2 bits per index value.

Register R6 may buffer path data from the circuits 204c and 204d to the circuit 190. The registers R7, R8 and R9 may buffer paths from the register R10 to the circuit 212. Register R10 may buffer paths from the circuit 190 to the circuit 212 and the registers R7, R8 and R9. Registers R6, R7, R8, R9 and R10 may implement (8×Pw)-bit registers, where Pw is a width of each path.

The following example generally describes the functionality of the circuit 200 for a case where a constraint length m=8 and the number of states is $S=2^m=256$. A codeword of length 2×N may be received by the circuit 200 in the signal DATA. The parameter N generally means that the radix-4 trellis 100 may have N stages and the Viterbi decoding process may utilize N stages. Processing each stage generally involves $(2^{(m-3)})+1$ clock cycles (e.g., 33 clock cycles for m=8). If the numbers of the stages start from 1, in each odd stage, information may be read from the circuits 204a and 204c and written to the circuits 204b and 204d respectively. In each even stage, information is generally read from the circuits 204b and 204d and written to the circuits 204a and 204c respectively. FIG. 11 generally illustrates an odd stage.

Consider some given odd stage. Let t0 be a beginning clock cycle of the given stage. Let d be a delay (latency) of the circuit 206 to calculate the branch metrics. In some embodiments, d=4 clock cycles. Hence, an initial set of branch metrics may be ready to present from the circuit 206 to the circuit 140 at the moment t0+d. At the moment t0+d−2, one or more read control signals may be presented to the circuit 204a with the signal R_A_ADR set to a zero address. At the moment t0+d−1, an initial set of state metrics may be transferred from the circuit 204a to the register R0. At the moment t0+d, the set of state metrics buffered in the register R0 may be transferred to the circuit 140. Register R0 may always be enabled. In each subsequent clock cycle, the signal R_A_ADR may be incremented by 1 and a new portion of the state metrics may be received by the circuit 140.

The circuit 140 is generally implemented as a full logic circuit (e.g., combinational hardware logic only). Therefore at the moment t0+d, the output state metrics may be presented from the circuit 140 to the register R4. Register R4 may always be enabled. At the moment t0+d+1, an enable port of register R1 may be asserted (e.g., enable state) and the initial portion of the state metrics may be stored to the register R1. At the moment t0+d+2, the enable port of the register R2 may be enabled and the next portion of the state metrics are generally stored to the register R2. At the moment t0+d+3, an enable port of register R3 is asserted and another portion of the state metrics may be stored to the register R3. At the moment t0+d+4, the circuit 210 may receive the 4 portions of state metrics and at the same time from the registers R1 to R4. The circuit 210 may write the 4 permuted portions (e.g., successive state metrics values) into the 4 memory banks of the circuit 204b. Therefore, at the moment t0+d+4, one or more write control signals should be presented to the circuit 204b with the signal W_A_ADR set to the zero address.

The above operations may be repeated cyclically. For example, at each moment t0+d+(4×k), the write control signals to the circuit 204b may be asserted, the signal W_A_ADR may be incremented by 1 and a new portion from among the 32 state metrics values may be written in the 4 memory banks of the circuit 204b.

At the moment t0+d, the signal INDOUT may transfer index values from the circuit 140 to the register R5. Register R5 may always be enabled. At the moment t0+d+1, the index values may be presented from the register R5 to the circuit 190 in the signal INDIN. Therefore, at the moment t0+d−1, the read control signals may be presented to the circuit 204c with the signal R_P_ADR set to the zero address. At the moment t0+d, an initial set of paths may be transferred from the circuit 204c to the register R6. At the moment t0+d+1, the initial set of paths may be transferred from the register R6 to the circuit 190. Register R6 may always be enabled. In each subsequent clock cycle, the signal R_P_ADR may be incremented by 1 and a new portion of the paths is presented to the circuit 190.

The circuit 190 is generally implemented as a full logic circuit (e.g., combinational hardware logic only). Therefore, at the moment t0+d+1, the output paths may be presented from the circuit 190 to the register R10. Register R10 may always be enabled. At the moment t0+d+2, the enable port of register R7 may be asserted and the initial portion of the paths is stored in the register R7. At the moment t0+d+3, the enable port of register R8 may be asserted and a next portion of the paths is stored in the register R8. At the moment t0+d+4, the enable port of register R9 may be enabled and another portion of the paths may be stored in the register R9. At the moment, t0+d+5, the 4 portions of the paths may be transferred from the registers R7 to R10 to the circuit 212 in parallel. The circuit 212 may write the 4 permuted portions (e.g., successive paths) into the 4 memory banks of the circuit 204d simultaneously. Therefore, at the moment t0+d+5, the write control signals may be received by the circuit 204d with the signal W_P_ADR set to the zero address.

The above operations may be repeated cyclically. For example, at each moment t0+d+1+(4×k), the write control signals to the circuit 204d may be asserted, the signal W_P_ADR may be incremented by 1 and a new portion from among the 32 paths may be written in the 4 memory banks of the circuit 204d.

State metrics values and paths may be received by the circuit 208 beginning at the moment t0+d+1. At the moment t0+d+29, the signal R_A_ADR may become 31 and a last portion of the state metrics may be read from the circuit 204a. After 2 additional clock cycles (e.g., at the moment t0+d+31), a last portion of the state metrics may be written to the circuit 204b. After the moment t0+d+31, reads for the next stage may be started. Therefore, with a 2 clock cycle pause (delay) in each stage, a maximum of 34 clock cycles (2÷256/8 clock cycles) may be used per stage.

Alternatively, reading from circuit 204b for the next stage may begin at the moment t0+d+30 because the initial portion of the state metrics of the next stage is ready in the circuit 204b. Therefore, the number of clock cycles (iterations) per stage may be reduced from 34 to 33. Returning to the moment t0+d+29, the signal R_A_ADR becomes 31 and the last portion of the state metrics of the current stage may be read from the circuit 204a. At the moment t0+d+30, the signal R_A_ADR may be set to the zero address and presented to the circuit 204b. At the moment t0+d+31, a last portion of the state metrics of the current stage may be written to the circuit 204b. At the moment t0+d+32, the initial portion of state metrics of next stage may be transferred from the circuit 204b to the register R0 and the signal R_A_ADR may be incremented. At the moment t0+d+33, the initial portion of the state metrics of the next stage is generally transferred from the register R0 to the circuit 140. Therefore, the circuit 140 may begin processing of the next stage at the moment t0+d+33. Since the previous stage start of the circuit 140 occurred at the moment t0+d, the number of clock cycles of a stage is 33 for m=8, or $(2^{(m-3)})+1$ for the general case.

In even stages, the flow of information from the circuits 204a and 204c to the circuits 204b and 204d may be reversed. Information may be read from the circuits 204b and 204d to the registers R0 and R6 respectively, updated, and written from the circuits 210 and 212 into the circuits 204a and 204c. Therefore, processing time of a codeword of length K=2×N may be approximately 33×N=33×K/2 clock cycles. If N>20, the initial pair of bits of the decoded codeword may be presented from the circuit 200 after 33×20 clock cycles.

After all iterations have completed, the signal MAXADR may contain q1q2 ... q8. Suppose the last iteration has been written to the circuits 204b and 204d. Let p1p2 ... p32 be the path corresponding to the state identified in the signal MAXADR. Therefore, q1q2 ... q8p1p2 ... p32 may be the last several bits of the decoded codeword, where q1 is last bit of the decoded codeword.

The functions performed by the diagrams of FIGS. 3, 5-7 and 9-11 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 3, 5 and 9-11 represent logical data flows. The logical data flows are generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s). As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method for forward error correction decoding, comprising the steps of:
   (A) calculating a plurality of metrics of a codeword using a forward error correction process on a trellis having a plurality of stages;
   (B) updating said metrics over each of said stages;
   (C) permuting said metrics in each of said stages;
   (D) writing said metrics as permuted into a memory; and
   (E) generating a signal carrying a plurality of decoded bits of said codeword based on said metrics in said memory, wherein (i) said codeword has a length of K received symbols and (ii) said codeword is decoded using $C \times 2^m \times K$ clock cycles, C being a constant less than one and greater than zero, and m being a constraint length of said codeword.

2. The method according to claim 1, wherein said trellis comprises a radix-4 trellis.

3. The method according to claim 1, wherein said forward error correction process comprises at least one of a turbo decoding process and a Viterbi decoding process.

4. The method according to claim 1, wherein said calculating of said metrics is common to both a turbo decoding process and a Viterbi decoding process.

5. The method according to claim 1, wherein C has a value of approximately $1/16$th.

6. The method according to claim 1, wherein m has a value of 8 and said codeword is decoded using approximately $33 \times K/2$ clock cycles.

7. The method according to claim 1, wherein said codeword is compliant with (i) a first of a plurality of communications standards in a first of a plurality of configurations and (ii) a second of said communications standards in a second of said configurations.

8. The method according to claim 7, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

9. An apparatus comprising:
   a memory; and
   a circuit configured to (i) calculate a plurality of metrics of a codeword using a forward error correction process on a trellis having a plurality of stages, (ii) update said metrics over each of said stages, (iii) permute said metrics in each of said stages, (iv) write said metrics as permuted into said memory and (v) generate a signal carrying a plurality of decoded bits of said codeword based on said metrics in said memory, wherein (a) said codeword has a length of K received symbols and (b) said codeword is decoded using $C \times 2^m \times K$ clock cycles, C being a constant less than one and greater than zero, and m being a constraint length of said codeword.

10. The apparatus according to claim 9, wherein said trellis comprises a radix-4 trellis.

11. The apparatus according to claim 9, wherein said forward error correction process comprises at least one of a turbo decoding process and a Viterbi decoding process.

12. The apparatus according to claim 9, wherein said calculating of said metrics is common to both a turbo decoding process and a Viterbi decoding process.

13. The apparatus according to claim 9, wherein C has a value of approximately $1/16$th.

14. The apparatus according to claim 9, wherein m has a value of 8 and said codeword is decoded using approximately $33 \times K/2$ clock cycles.

15. The apparatus according to claim 9, wherein said codeword is compliant with (i) a first of a plurality of communications standards in a first of a plurality of configurations and (ii) a second of said communications standards in a second of said configurations.

16. The apparatus according to claim 15, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

17. The apparatus according to claim 9, wherein said apparatus is implemented as at least one integrated circuit.

18. An apparatus comprising:
   means for calculating a plurality of metrics of a codeword using a forward error correction process on a trellis having a plurality of stages;
   means for updating said metrics over each of said stages;
   means for permuting said metrics in each of said stages;
   means for writing said metrics as permuted into a memory; and
   means for generating a signal carrying a plurality of decoded bits of said codeword based on said metrics in said memory wherein (i) said codeword has a length of K received symbols and (ii) said codeword is decoded using $C \times 2^m \times K$ clock cycles, C being a constant less than one and greater than zero, and m being a constraint length of said codeword.

* * * * *